United States Patent
Lim

(10) Patent No.: US 7,642,159 B2
(45) Date of Patent: Jan. 5, 2010

(54) SEMICONDUCTOR DEVICE AND METHOD FOR MANUFACTURING THE SAME

(75) Inventor: Tae Hong Lim, Incheon (KR)

(73) Assignee: Dongbu HiTek Co., ltd., Seoul (KR)

( * ) Notice: Subject to any disclaimer, the term of this patent is extended or adjusted under 35 U.S.C. 154(b) by 0 days.

(21) Appl. No.: 11/551,375

(22) Filed: Oct. 20, 2006

(65) Prior Publication Data
US 2007/0102758 A1    May 10, 2007

(30) Foreign Application Priority Data
Oct. 21, 2005   (KR) .................. 10-2005-0099662

(51) Int. Cl.
*H01L 21/336*  (2006.01)
*H01L 21/38*   (2006.01)

(52) U.S. Cl. ............... 438/259; 438/270; 438/589

(58) Field of Classification Search ............ 257/288; 438/212, 259, 270–272, 589, E27.096, E27.055, 438/E27.57, E27.58
See application file for complete search history.

(56) References Cited

U.S. PATENT DOCUMENTS

| | | | |
|---|---|---|---|
| 5,106,776 A * | 4/1992 | Shen et al. | 438/248 |
| 2002/0197823 A1* | 12/2002 | Yoo et al. | 438/424 |
| 2003/0025153 A1* | 2/2003 | Chun | 257/330 |
| 2004/0259311 A1* | 12/2004 | Kim | 438/259 |
| 2005/0001252 A1* | 1/2005 | Kim et al. | 257/296 |
| 2005/0074950 A1* | 4/2005 | Lin et al. | 438/445 |

FOREIGN PATENT DOCUMENTS

| | | |
|---|---|---|
| CN | 1649111 | 8/2005 |
| KR | 1020020055147 A | 7/2002 |

* cited by examiner

*Primary Examiner*—Cuong Q Nguyen
(74) *Attorney, Agent, or Firm*—Sherr & Vaughn, PLLC

(57) ABSTRACT

A semiconductor device may include a semiconductor substrate having a recessed surface, a gate insulating layer formed on the recessed surface of the semiconductor substrate, a gate electrode formed on the gate insulating layer, and a source/drain area formed at both sides of the gate electrode, according to embodiments.

16 Claims, 3 Drawing Sheets

SEMICONDUCTOR DEVICE AND METHOD FOR MANUFACTURING THE SAME

The present application claims priority under 35 U.S.C. 119 and 35 U.S.C. 365 to Korean Patent Application No. 10-2005-0099662 (filed on Oct. 21, 2005), which is hereby incorporated by reference in its entirety.

BACKGROUND

A Semiconductor device may be provided on a device area thereof, which may be defined through a LOCOS (local oxidation of silicon) process and/or an STI (swallow trench isolation) process. A transistor formed as part of a semiconductor device may include a gate, a source and a drain.

A transistor of a semiconductor device may be fabricated by first forming a gate insulating layer on a semiconductor substrate having a STI layer. A poly-silicon layer may then be deposited on the gate insulating layer. A STI layer may electrically isolate devices formed on a semiconductor substrate from each other, thereby preventing malfunction of the devices.

A photolithography process may be performed with respect to a gate insulating layer and a poly-silicon layer, thereby forming a gate electrode. The gate electrode may be formed on a prescribed region of the semiconductor substrate where a STI layer is not formed.

High-density dopants may be implanted onto a semiconductor substrate by using an ion implantation device. A gate electrode may be used as a mask. Source and drain junction areas may be formed on active areas of a semiconductor substrate, which are exposed on both sides of a gate electrode.

As semiconductor devices have become more densely integrated, it is possible to form hundreds of millions of transistors on a single wafer. In addition, as semiconductor devices become smaller, a critical dimension (CD) of a gate electrode of a transistor may be reduced, such that a length of a channel formed below the gate electrode may be shortened. As a result, a threshold voltage (Vth) of a transistor may be reduced, which may cause leakage current in a semiconductor device.

SUMMARY

Embodiments relate to a semiconductor device with a channel having a relatively long length. In embodiments, a semiconductor device includes a semiconductor substrate having a recessed surface, a gate insulating layer formed on the recessed surface of the semiconductor substrate, a gate electrode formed on the gate insulating layers; and a source/drain area formed at both sides of the gate electrode.

In embodiments, a method of manufacturing a semiconductor includes forming a wet oxide layer on part of a semiconductor substrate, forming a recessed surface on the semiconductor substrate (e.g. by removing the wet oxide layer), forming a gate insulating layer on the recessed surface of the semiconductor substrate, forming a gate electrode on the gate insulating layer, and implanting dopants on both sides of the gate electrode to form a source/drain area.

In embodiments, a method of manufacturing a semiconductor includes forming a recessed surface on a semiconductor substrate by wet-etching a part of the semiconductor substrate, forming a gate insulating layer on the recessed surface of the semiconductor substrate, forming a gate electrode on the gate insulating layer, and implanting dopants on both sides of the gate electrode to form a source/drain area.

BRIEF DESCRIPTION OF THE DRAWINGS

Example

Example

DETAILED DESCRIPTION OF EMBODIMENTS

Figure 1:
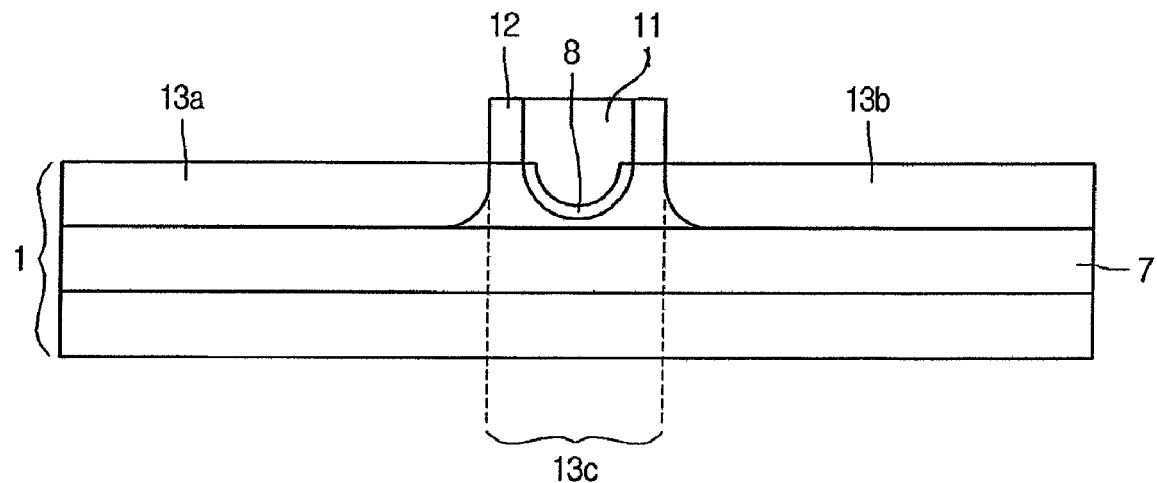
FIG. 1 shows a sectional view illustrating a semiconductor device according to embodiments.

Embodiments will be described with reference to the accompanying drawings. It is understood that the embodiments described herein are not intended to be limiting.

In the example figures, thicknesses of layers and areas may be enlarged for the purpose of clarity. The same reference numerals will be used to refer to the same elements throughout the description. When layers, films, areas and plates are expressed as they are formed on other elements, it may not exclude another elements interposed therebetween for convenience of description. In contrast, if elements are expressed as they are directly formed on other elements, it may exclude another elements interposed therebetween for convenience of description.

Example FIG. 1 illustrates a sectional view of a semiconductor device according to embodiments. Example FIGS. 2 through 6 show sectional views illustrating a procedure for manufacturing a semiconductor device according to embodiments.

As illustrated in example FIG. 1, gate insulating layer 8 and buried gate electrode 11 may be formed on semiconductor substrate 1, which may include well 7. Source area 13a and drain area 13b may be formed on prescribed and/or predetermined portions of semiconductor substrate 1, which may be exposed at both sides of buried gate electrode 11. A prescribed portion of semiconductor substrate 1, where the buried gate electrode 11 is formed, may be recessed, according to embodiments. Part of buried gate electrode 11 may have a height corresponding to that of source/drain areas 13a and 13b. Embodiments may also include sidewall 12. Channel area 13c may be formed below buried gate electrode 11.

Figure 2:
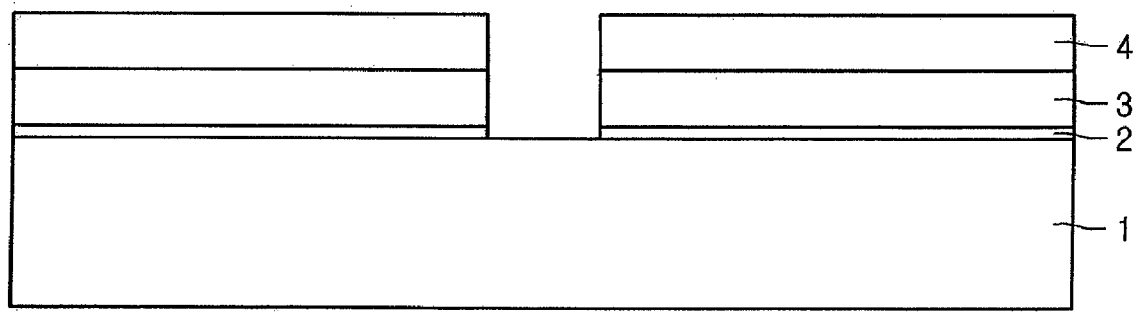
FIGS. 2 through 6 show sectional views illustrating a procedure for manufacturing a semiconductor device according to embodiments.

As illustrated in example FIG. 2, oxide layer 2, nitride layer 3, and first photoresist film 4 may be formed on semiconductor substrate 1. Nitride layer 3 and oxide layer 2 may be etched until semiconductor substrate 1 has been exposed to the exterior. First photoresist film 4 may be used as an etch mask.

Figure 3:
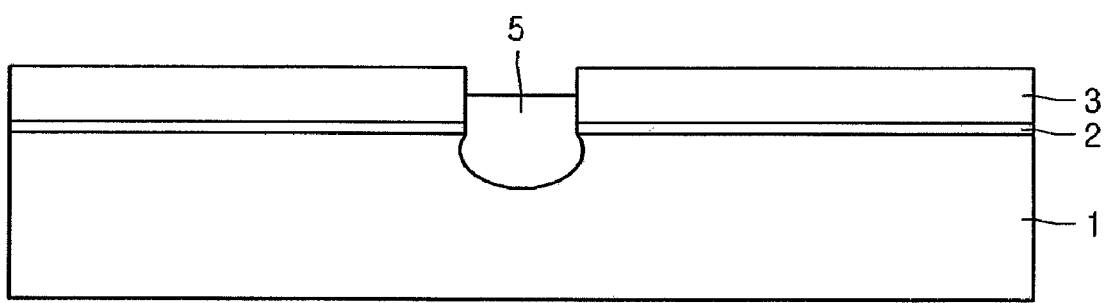

As illustrated in example FIG. 3, first photoresist film 4 may be removed and wet oxide layer 5 having a relatively large thickness may be formed on an exposed portion of semiconductor substrate 1 by feeding oxygen ($O_2$) and hydrogen ($H_2$) under a high temperature condition, according to embodiments. Those skilled in the art will recognize that other thicknesses may be used and that other elements and/or temperatures could be used to form a wet oxide layer.

Figure 4:
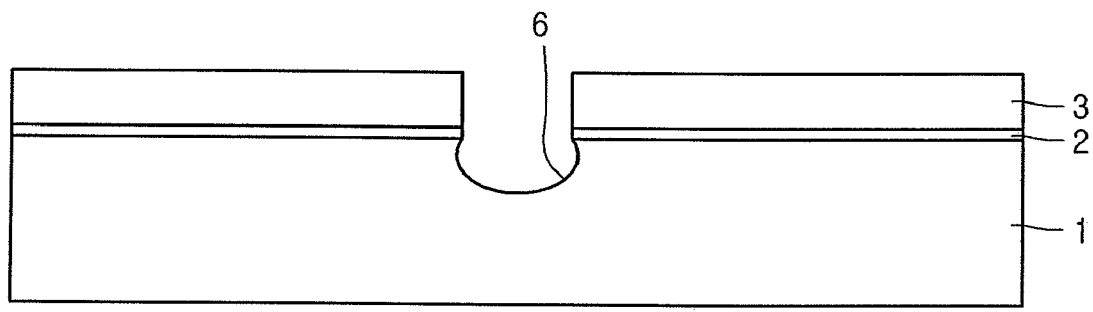

As illustrated in example FIG. 4, wet oxide layer 5 may be removed (e.g. using an HF solution) to expose semiconductor substrate 1. Surface 6 of exposed semiconductor substrate 1 may be recessed. In embodiments, surface 6 of semiconductor substrate 1 may be recessed by directly removing a portion of semiconductor substrate 1 through a wet etching process, without forming wet oxide layer 5 on semiconductor substrate 1.

Figure 5:
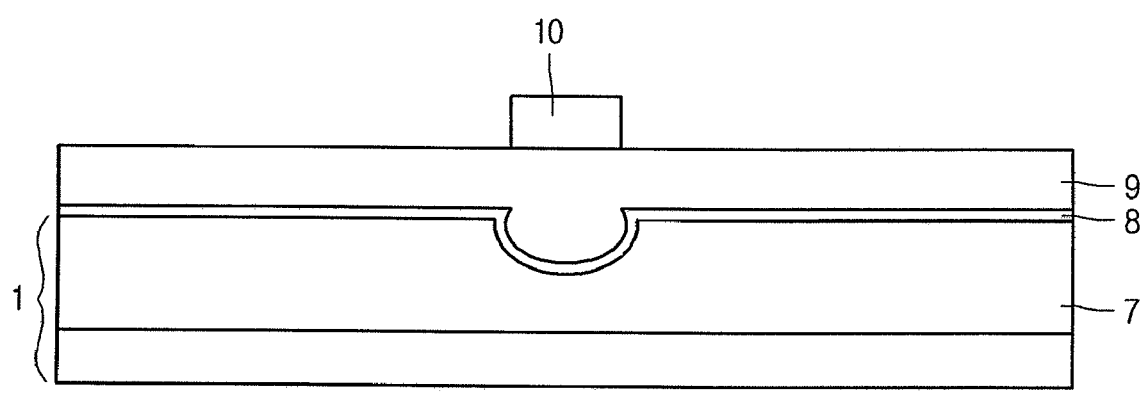

As illustrated in example FIG. 5, nitride layer 3 and oxide layer 2 may be removed and low-density conductive materials may be implanted onto semiconductor substrate 1, to form well 7. In addition, gate insulating layer 8 and poly-silicon layer 9 may be formed on semiconductor substrate 1 and second photoresist film 10 may be formed on poly-silicon layer 9.

Figure 6:
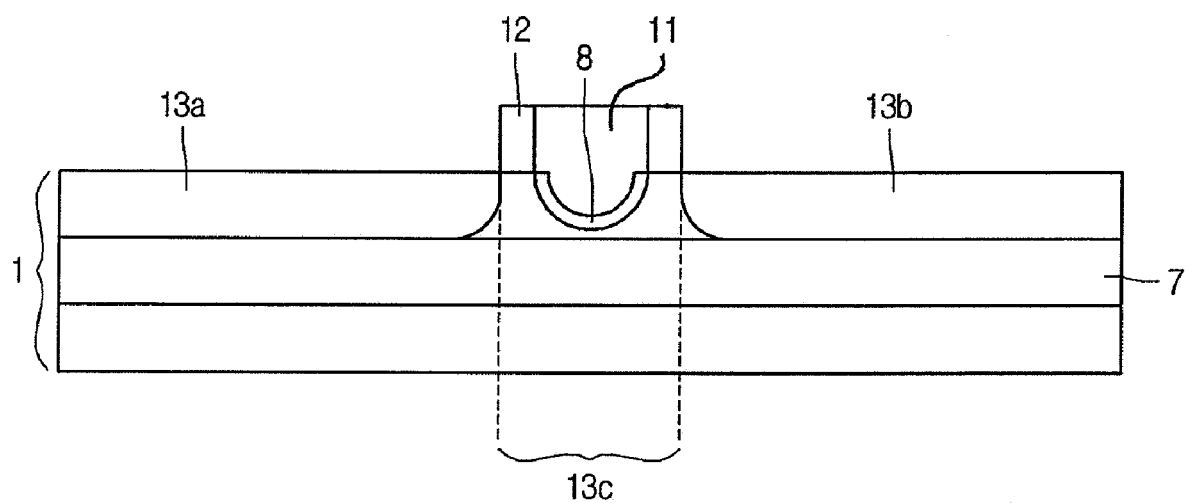

As illustrated in example FIG. 6, poly-silicon layer 9 may be etched using second photoresist film 10 as an etch mask, to form buried gate electrode 11. Sidewall 12 may then be formed on lateral sides of buried gate electrode 11 and gate insulating layer 8. In addition, high-density dopants may be implanted onto semiconductor substrate 1 using buried gate electrode 11 as a mask. Source and drain areas 13a and 13b may thus be formed according to embodiments.

Since surface 6 of semiconductor substrate 1 adjacent to buried gate electrode 11 is recessed, the CD of buried gate electrode 11 may be enlarged relative to the CD of the buried gate electrode formed on a flat semiconductor substrate. As a result, channel area 13c formed below the buried gate electrode 11 may also be enlarged, such that the length of the channel may increase, according to embodiments.

The threshold voltage (Vth) of the transistor may therefore be stabilized during the operation of a semiconductor device and leakage current of the semiconductor device may be reduced or substantially prevented.

According to embodiments, because the surface of the semiconductor substrate adjacent to the buried gate electrode is recessed, the length of the channel formed below the buried gate electrode may increase, so that the leakage current of the semiconductor device may be substantially or completely prevented and the characteristics of the semiconductor device may be improved.

It will be apparent to those skilled in the art that various modifications and variations can be made to the embodiments. Thus, it is intended that embodiments cover the modifications and variations thereof within the scope of the appended claims.

What is claimed is:

1. A method comprising:
    sequentially forming an oxide layer, a nitride layer and a photoresist film on a semiconductor substrate, wherein the first photoresist is formed directly on and contacting the nitride layer;
    simultaneously removing a portion of the nitride layer and the oxide layer using the first photoresist film as a mask to expose a portion of the semiconductor substrate;
    forming a wet oxide layer on the exposed portion of the semiconductor substrate and contacting sidewalls of the oxide layer and the nitride layer;
    forming a recessed surface in the exposed portion of the semiconductor substrate by removing the wet oxide layer;
    forming a gate insulating layer on the recessed surface of the semiconductor substrate;
    forming a gate electrode over the gate insulating layer; and
    forming sidewall on sides of the gate electrode and the gate insulating layer such that the uppermost surface of the sidewalls are coplanar with the uppermost surface of the gate electrode;
    implanting dopants on both sides of the gate electrode to form a source/drain area.

2. The method of claim 1, wherein the wet oxide layer is removed using an HF solution.

3. The method of claim 1, wherein the wet oxide layer is removed using oxygen and hydrogen.

4. The method of claim 1, comprising forming a portion of the gate electrode with a height substantially equal to a height of the source/drain area.

5. The method of claim 1, comprising forming the gate insulating layer to have a substantially concave shape.

6. The method of claim 1, comprising forming the gate electrode to have a bottom surface having a substantially concave shape.

7. A method comprising:
    forming a recessed surface on a semiconductor substrate by wet-etching a prescribed portion of the semiconductor substrate;
    forming a gate insulating layer on the recessed surface of the semiconductor substrate;
    forming a gate electrode on the gate insulating layer;
    forming sidewalls on lateral sides of the gate electrode and the gate insulating layer such that the entire uppermost surface of the sidewalls is coplanar with the uppermost surface of the gate electrode; and then
    implanting dopants on the sides of the gate electrode to form a source/drain area.

8. The method of claim 7, wherein a portion of the gate electrode is formed to have a height substantially equal to a height of the source/drain area.

9. The method of claim 7, wherein the gate insulating layer is formed in a substantially concave shape.

10. The method of claim 7, wherein the gate electrode is formed to have a bottom surface with a substantially concave shape.

11. A method comprising:
    sequentially forming a first oxide layer, a nitride layer and a first photoresist film on a semiconductor substrate;
    exposing a portion of the uppermost surface of the semiconductor substrate by performing a first etching process on the nitride layer and the first oxide layer using the first photoresist film as a mask; and then
    removing the first photoresist film; and then
    forming a second oxide layer on the exposed portion of the semiconductor substrate and contacting sidewalls of the first oxide layer and the nitride layer by feeding gaseous oxygen ($O_2$) and gaseous hydrogen ($H_2$) under a high temperature condition; and then
    forming a recess in the exposed portion of the semiconductor substrate by removing the second oxide layer using an hydrofluoric acid (HF) solution; and then
    removing the nitride layer and the first oxide layer to expose the uppermost surface of the semiconductor substrate; and then
    sequentially forming a gate insulating layer, a poly-silicon layer and a second photoresist film on the semiconductor substrate including in the recess; and then
    forming a buried electrode in the recess by performing a second etching process on the poly-silicon layer; and then
    forming sidewalls on lateral sides of the buried gate electrode and the gate insulating layer.

12. The method of claim 11, further comprising, after forming the recess in the exposed portion of the semiconductor substrate and before forming a buried electrode in the recess:
    forming a well in the semiconductor substrate by implanting low-density conductive materials therein.

13. The method of claim 11, wherein sequentially forming a gate insulating layer and a poly-silicon layer further comprises forming a second photoresist film on the poly-silicon layer, wherein the second photoresist film is used as an etch mask to form the buried gate electrode.

14. The method of claim 11, further comprising, after forming sidewalls on lateral sides of the buried gate electrode and the gate insulating layer:

forming source and drain areas in the semiconductor substrate by implanting high-density dopants in the semiconductor substrate using the buried gate electrode as a mask.

15. The method of claim 11, wherein the second oxide layer comprises a wet oxide layer.

16. The method of claim 11, wherein the uppermost surface of the sidewalls are coplanar with the uppermost surface of the gate electrode.

* * * * *